United States Patent
Zhao (10) Patent No.: US 11,942,320 B2
(45) Date of Patent: Mar. 26, 2024

(54) METHOD OF MANUFACTURING SEMICONDUCTOR STRUCTURE

(71) Applicant: CHANGXIN MEMORY TECHNOLOGIES, INC., Hefei (CN)

(72) Inventor: Kun Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 422 days.

(21) Appl. No.: 17/602,873

(22) PCT Filed: Jul. 12, 2021

(86) PCT No.: PCT/CN2021/105772
§ 371 (c)(1),
(2) Date: Oct. 11, 2021

(87) PCT Pub. No.: WO2022/179037
PCT Pub. Date: Sep. 1, 2022

(65) Prior Publication Data
US 2023/0059262 A1 Feb. 23, 2023

(30) Foreign Application Priority Data
Feb. 26, 2021 (CN) .......................... 202110219010.4

(51) Int. Cl.
*H01L 21/02* (2006.01)
*C23C 16/02* (2006.01)
(Continued)

(52) U.S. Cl.
CPC ...... *H01L 21/0217* (2013.01); *C23C 16/0272* (2013.01); *C23C 16/345* (2013.01);
(Continued)

(58) Field of Classification Search
CPC ............ H01L 21/0217; H01L 21/02274; H01L 21/0228; C23C 16/345; C23C 16/45534; C23C 16/45536
See application file for complete search history.

(56) References Cited

U.S. PATENT DOCUMENTS 7,655,987 B2  2/2010 Chen et al.
10,580,645 B2  3/2020 Ueda et al.
(Continued)

FOREIGN PATENT DOCUMENTS

CN  1819121 A  8/2006
CN  101459111 A  6/2009
(Continued)

OTHER PUBLICATIONS

First Office Action cited in CN Application No. 202110219010.4, dated Mar. 3, 2022, 12 pages.

*Primary Examiner* — Joseph C. Nicely
(74) *Attorney, Agent, or Firm* — Cooper Legal Group, LLC (57) ABSTRACT

An embodiment of the present disclosure provides a method of manufacturing a semiconductor structure. The method includes: providing a base; and forming a silicon nitride film layer on the base by an atomic layer deposition process, where the atomic layer deposition process includes multiple cyclic deposition steps; in each of the cyclic deposition steps, a silicon source gas and a nitrogen source gas are provided to a surface of the base; before each of the cyclic deposition steps, the method of manufacturing a semiconductor structure further includes a repair step; in the repair step, a repair gas is provided to the surface of the base, and the repair gas is a hydrogen-containing repair gas; the repair gas includes a polar molecule for repairing the surface of the base that is damaged.

20 Claims, 4 Drawing Sheets

(51) Int. Cl.
*C23C 16/34* (2006.01)
*C23C 16/455* (2006.01)

(52) U.S. Cl.
CPC .. *C23C 16/45534* (2013.01); *C23C 16/45536* (2013.01); *H01L 21/02274* (2013.01); *H01L 21/0228* (2013.01)

(56) References Cited

U.S. PATENT DOCUMENTS

| | | |
|---|---|---|
| 2003/0228770 A1 | 12/2003 | Lee et al. |
| 2015/0099374 A1* | 4/2015 | Kakimoto ......... C23C 16/45542 118/724 |
| 2016/0099358 A1 | 4/2016 | Kawashima et al. |
| 2018/0323056 A1 | 11/2018 | Woodruff et al. |
| 2021/0198787 A1* | 7/2021 | Tonegawa ......... H01J 37/32449 |

FOREIGN PATENT DOCUMENTS

| | | |
|---|---|---|
| CN | 103426818 A | 12/2013 |
| CN | 104022018 A | 9/2014 |
| CN | 110120343 A | 8/2019 |
| CN | 110408906 A | 11/2019 |
| CN | 111900075 A | 11/2020 |
| CN | 111933709 A | 11/2020 |
| CN | 113025991 A | 6/2021 |
| GB | 2343461 A | 5/2000 |
| JP | 2000311868 A | 11/2000 |

\* cited by examiner

METHOD OF MANUFACTURING SEMICONDUCTOR STRUCTURE

CROSS-REFERENCE TO RELATED APPLICATIONS

The present disclosure is a national stage of International Patent Application No. PCT/CN2021/105772, filed on Jul. 12, 2021, which claims the priority to Chinese Patent Application No. 202110219010.4, titled "METHOD OF MANUFACTURING SEMICONDUCTOR STRUCTURE", filed to China National Intellectual Property Administration (CNIPA) on Feb. 26, 2021. The entire contents of International Patent Application No. PCT/CN2021/105772 and Chinese Patent Application No. 202110219010.4 are incorporated herein by reference.

TECHNICAL FIELD

The present disclosure relates to, but is not limited to, a method of manufacturing a semiconductor structure.

BACKGROUND

The manufacture of the semiconductor structure often involves an etching process due to process requirements, and the process requirements can be achieved through mature control of necessary process parameters. However, there are many uncontrollable factors in the etching process, and the etching process will inevitably cause certain damage to the surface of the base, which will affect the adhesion effect between the base and the film layer, thereby affecting the yield and electrical performance of the semiconductor structure.

Therefore, it is necessary to repair the damaged surface of the base after the etching process.

SUMMARY

An overview of the subject matter detailed in the present disclosure is provided below, which is not intended to limit the protection scope of the claims.

An embodiment of the present disclosure provides a method of manufacturing a semiconductor structure. The method includes: providing a base; and forming a silicon nitride film layer on the base by an atomic layer deposition process, where the atomic layer deposition process includes multiple cyclic deposition steps; in each of the cyclic deposition steps, a silicon source gas and a nitrogen source gas are provided to a surface of the base; wherein, before each of the cyclic deposition steps, the method of manufacturing a semiconductor structure further includes a repair step; in the repair step, a repair gas is provided to the surface of the base, and the repair gas is a hydrogen-containing repair gas; the repair gas includes a polar molecule for repairing the surface of the base that is damaged.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

As mentioned in the background, the yield and electrical performance of the semiconductor structure in the prior art need to be improved.

The manufacture of semiconductor structures often involves an etching process. The etching process will inevitably cause certain damage to the surface of the base, such as increasing the number of broken chemical bonds on the surface of the base, which will affect the adhesion effect or the stability of electrical connection between the base and other structure in the semiconductor structure, thereby affecting the yield and electrical performance of the semiconductor structure.

Figure 1:
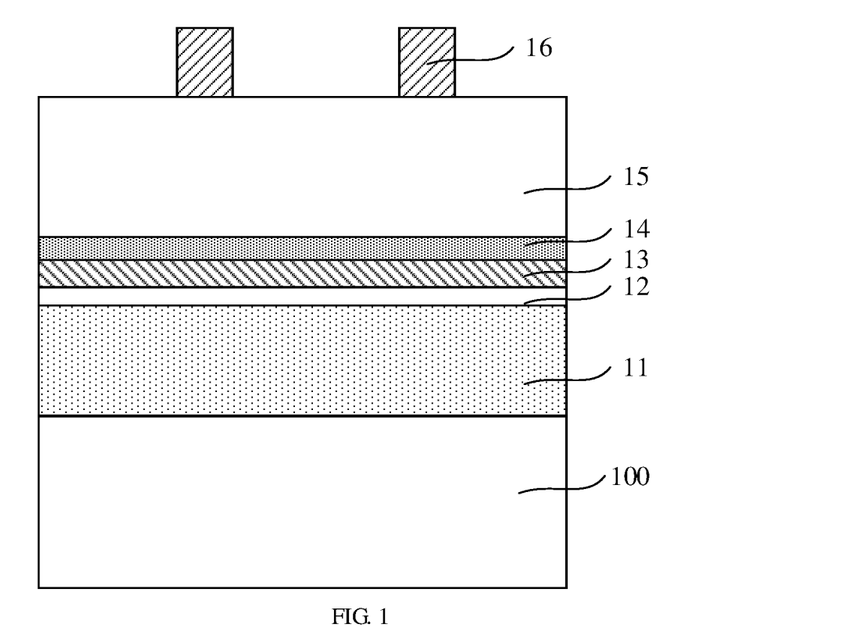
FIG. 1 is a sectional view illustrating a structure obtained by implementing a step of forming a pattern layer of a semiconductor structure according to an embodiment of the present disclosure.

Referring to FIG. 1, when a bit line structure in a semiconductor structure is manufactured, an initial bit line contact layer 11, an initial transition layer 12, an initial diffusion barrier layer 13, an initial metal layer 14 and an initial bit line insulating layer 15 are sequentially stacked on a substrate 100.

Figure 2:
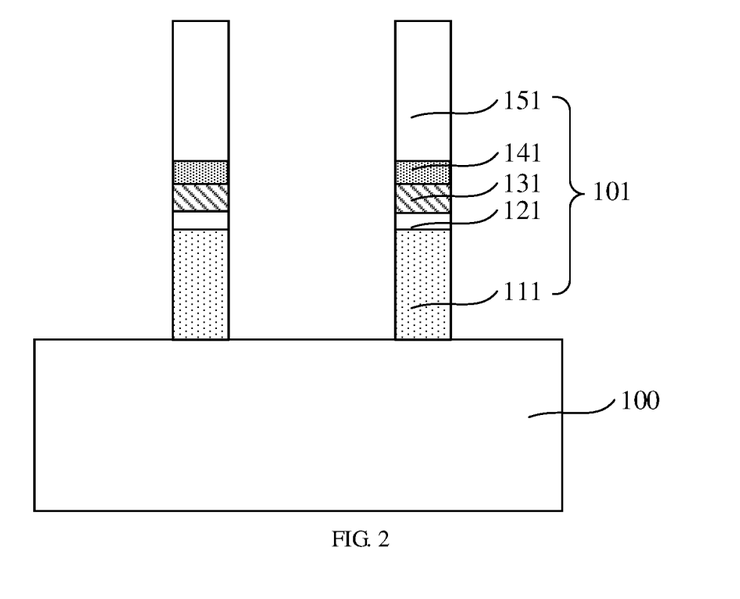
FIG. 2 is a sectional view illustrating a structure obtained by implementing a step of forming a bit line structure of the semiconductor structure by an etching process according to an embodiment of the present disclosure.

Referring to FIG. 1 and FIG. 2, a pattern layer 16 with an opening is formed on the initial bit line contact layer 11, the initial transition layer 12, the initial diffusion barrier layer 13, the initial metal layer 14 and the initial bit line insulating layer 15. By using the pattern layer 16 as a mask, the initial bit line contact layer 11, the initial transition layer 12, the initial diffusion barrier layer 13, the initial metal layer 14 and the initial bit line insulating layer 15 are etched along the opening by an etching process to form a bit line structure 101. The bit line structure 101 includes a bit line contact layer 111, a transition layer 121, a diffusion barrier layer 131, a metal layer 141 and a bit line insulating layer 151 that are sequentially stacked. The bit line contact layer 111 is made of polysilicon, the transition layer 121 is made of titanium, the diffusion barrier layer 131 is made of titanium nitride, the metal layer 141 is made of tungsten, and the bit line insulating layer 151 is made of silicon nitride.

After the bit line structure 101 is formed, the etching process causes certain damage to exposed surfaces of the substrate 100 and the bit line structure 101, such that there are a large number of broken chemical bonds on the surface of the substrate 100 and the surface of the bit line structure 101. Thus, there are many hydrogen ions and hydroxide ions on the surface of the substrate 100 and the surface of the bit line structure 101. They will affect the conductivity at a contact between the bit line structure 101 and the substrate 100, and affect the adhesion effect of a subsequent film layer to the surface of the substrate 100 and the surface of the bit line structure 101, thereby affecting the yield and electrical performance of the formed semiconductor structure.

An embodiment of the present disclosure provides a method of manufacturing a semiconductor structure. In this method, when a silicon nitride film layer is formed on a base by an atomic layer deposition process, a hydrogen-containing repair gas including a polar molecule is provided to a surface of the base before each of cyclic deposition steps is performed. Since a hydrogen-containing polar bond in the polar molecule is easily broken, there are many free hydrogen ions in the repair gas. The hydrogen ions combine with a large number of hydrogen ions and hydroxide ions on the surface of the base through a valence bond to generate hydrogen and water vapor. The hydrogen and water vapor are easy to escape from the base, which reduces the hydrogen and oxygen content in the base, and improves the strength and damage resistance of the base, thereby achieving the effect of repairing the damaged surface of the base.

The embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 4:
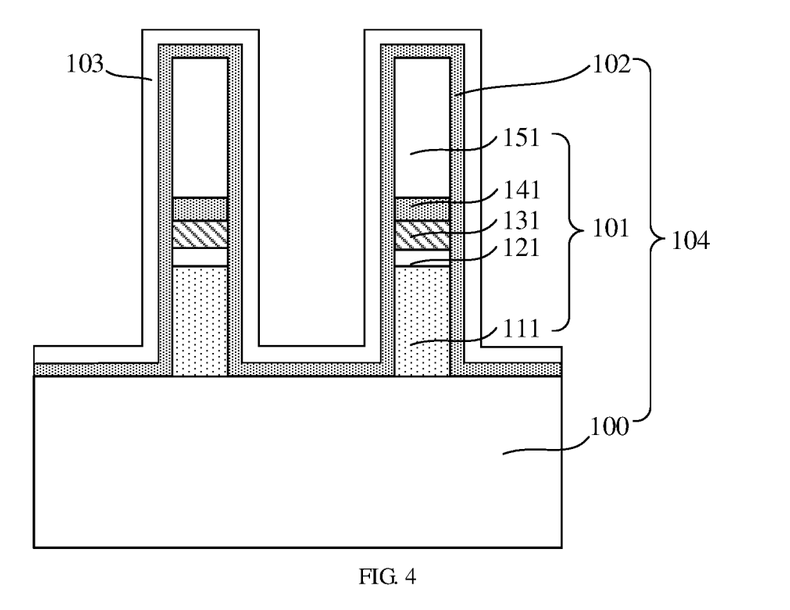
FIG. 4 is a sectional view illustrating a structure obtained by implementing a step of forming a silicon nitride film layer of the semiconductor structure according to an embodiment of the present disclosure.
Figure 5:
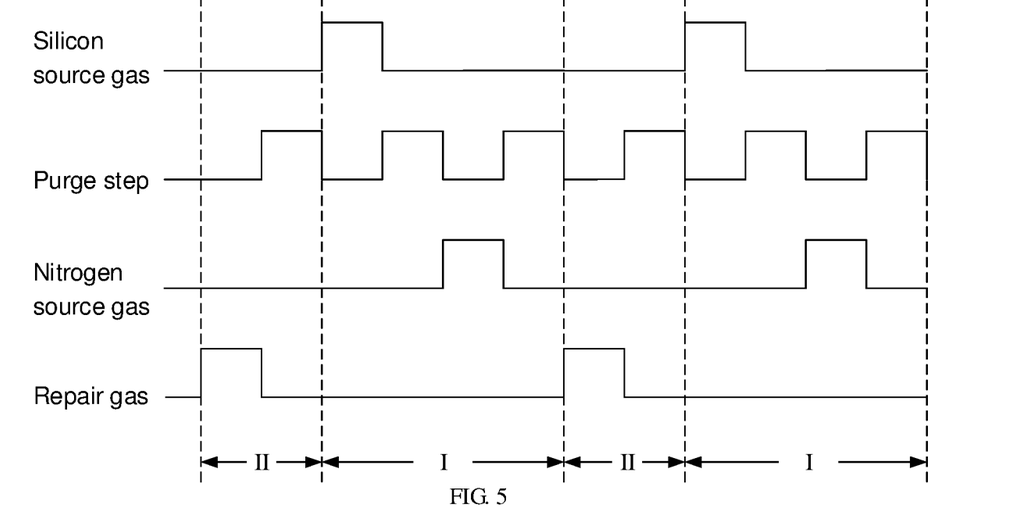
FIG. 5 illustrates a first cyclic change trend corresponding to each step when a silicon nitride film layer is deposited according to an embodiment of the disclosure.

Referring to FIGS. 4 and 5, a base 104 is provided. A silicon nitride film layer 103 is formed on the base 104 by an atomic layer deposition process. The atomic layer deposition process includes multiple cyclic deposition steps I. In each of the cyclic deposition steps I, a silicon source gas and a nitrogen source gas are provided to a surface of the base 104.

In this embodiment, the silicon source gas is dichlorosilane, and the nitrogen source gas is ammonia gas. In other embodiments, the silicon source gas may also be at least one of the group consisting of silane, disilane, trichlorosilane and hexachlorodisilane, and the nitrogen source gas may also be nitrogen.

In this embodiment, the silicon nitride film layer 103 formed on the surface of the base 104 has desirable compactness and strong impurity shielding ability, which can well protect the base 104 and avoid damage to the base 104 caused by a subsequent etching process.

Referring to FIG. 5, the method further includes a repair step II before each of the cyclic deposition steps I. In the repair step II, a hydrogen-containing repair gas is provided to the surface of the base 104. The repair gas includes a polar molecule for repairing the surface of the base 104 that is damaged.

The polar molecule in the repair gas is a gaseous hydrogen-containing polar molecule. Since a hydrogen-containing polar bond in the polar molecule is easily broken, there are many free hydrogen ions in the repair gas. When the repair gas contacts the surface of the base 104 and further enters the base 104, the hydrogen ions combine with a large number of hydrogen ions and hydroxide ions on the surface of the base 104 through a valence bond to generate hydrogen gas and water vapor. This reduces the hydrogen and oxygen content of the base 104, and improves the strength and damage resistance of the base 104, thereby achieving the effect of repairing the damaged surface of the base 104.

Figure 6:
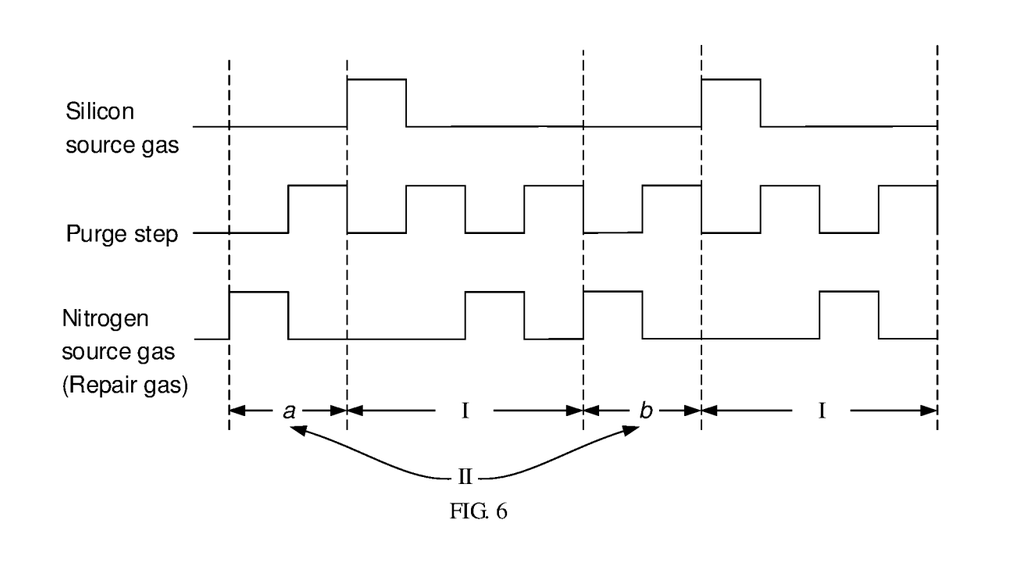
FIG. 6 illustrates a second cyclic change trend corresponding to each step when the silicon nitride film layer is deposited according to an embodiment of the disclosure.

In this embodiment, referring to FIG. 6, the repair gas and the nitrogen source gas are the same type of gas, so the equipment for supplying the repair gas and the nitrogen source gas to the surface of the base 104 can be the same equipment, which reduces the equipment cost for manufacturing the semiconductor structure. Moreover, the repair gas and the nitrogen source gas can be controlled by the same equipment, which simplifies the manufacturing process of the semiconductor structure. In addition, there is no need to use other gas sources, which reduces the raw material cost for manufacturing the semiconductor structure.

Like the nitrogen source gas, the repair gas includes ammonia gas. The ammonia gas in the repair gas is used to repair the damaged surface of the base 104 (refer to FIG. 4) through a valence bond, so as to improve the strength and damage resistance of the base 104. Other film layer will further be formed on the surface of the base 104 subsequently. By reducing the degree of damage to the surface of the base 104, the adhesion effect between the film layer and the base 104 can be improved, thereby improving the yield of the formed semiconductor structure. The ammonia gas in the nitrogen source gas is used as a raw material for forming the silicon nitride film layer 103.

In other embodiments, the repair gas may also be gaseous hydrogen sulfide, hydrogen peroxide or ethanol.

In this embodiment, the base 104 is internally provided with buried word lines, shallow trench isolation structures, active areas and bit line structures, etc. In the process of forming the silicon nitride film layer 103, the repair gas provided to the surface of the base 104 reduces the degree of damage to the surface of the base 104, and improves the stability of electrical connection between the structures in the base 104, thereby improving the electrical performance of the formed semiconductor structure.

Referring to FIG. 6, the repair step II includes a first repair step a and a second repair step b. The first repair step a is performed before a first cyclic deposition step I, and the second repair step b is performed between every two adjacent cyclic deposition steps I. The duration of the first repair step a is longer than the duration of the second repair step b.

Since the first repair step a is performed before the first cyclic deposition step I, the repair gas directly contacts the surface of the base 104 (refer to FIG. 4) to repair the damaged surface of the base 104. The repair gas in the subsequent second repair step b needs to penetrate through the formed silicon nitride film layer to contact the surface of the base 104 so as to repair the damaged surface of the base 104. The duration of the first repair step a is longer than that of the second repair step b, such that the repair gas repairs most of the damaged surface of the base 104 in the first repair step a. The subsequent second repair step b further improves the repair effect of the repair gas on the damaged surface of the base 104. In other embodiments, the duration of the first repair step may also be equal to that of the second repair step.

Referring to FIG. 6, after the repair step II, the method further includes a purge step to remove the repair gas. The repair gas is ammonia gas. The ammonia gas that is not involved in the valence bond in the repair step II will react with a by-product (hydrogen chloride) generated by a reaction of the silicon source gas and the nitrogen source gas in the subsequent cyclic deposition step I to generate granular ammonium chloride on the surface of the base 104. The granular ammonium chloride cannot be removed by purging and it will affect the deposition effect of the silicon nitride film layer in the next cyclic deposition step I. Therefore, the purge step is added after the repair step II. The purge step can remove the excess repair gas, and prevent the excess repair gas from reacting with the by-product generated in the subsequent cyclic deposition step I to produce ammonium chloride that is difficult to remove, thereby improving the quality of the formed silicon nitride film layer and the yield of the semiconductor structure.

In the cyclic deposition step I, the silicon source gas is provided to the surface of the base 104. The silicon source gas is maintained on the surface of the base 104 through a saturated adsorption reaction. After the silicon source gas is provided, before the nitrogen source gas is provided, the method further includes a purge step to remove excess silicon source gas that is not adsorbed on the surface of the base 104, so as to avoid affecting the subsequent cyclic deposition step I. Then, the nitrogen source gas is provided to the surface of the base 104 such that the nitrogen source gas reacts with the silicon source gas adsorbed on the surface of the base 104 to form a layer of silicon nitride in the form of a monatomic film. Since the reaction of the nitrogen source gas and the silicon source gas will also produce hydrogen chloride as a by-product, the method further includes a purge step before the second repair step b after the nitrogen source gas is provided. The purge step is configured to remove the excess nitrogen source gas and the by-product hydrogen chloride. It prevents the hydrogen chloride from reacting with the repair gas provided in the second repair step b to generate an impurity on the surface of the base 104 to affect the subsequent deposition effect of silicon nitride. Therefore, the purge step ensures the formation of a good-quality formed silicon nitride film layer 103, thereby improving the yield of the semiconductor structure.

In this embodiment, the atomic layer deposition process is a heat treatment atomic layer deposition process, and a process used in the repair step is a heat treatment process. The heat treatment process keeps the repair gas in a high-temperature state so as to improve the activity of the polar molecule in the repair gas, such that the hydrogen ions in the repair gas can more easily react with the hydrogen ions and hydroxide ions in the base 104, thereby improving the repair effect of the repair gas on the damaged surface of the base 104.

In some embodiments, the temperature in the repair step II is the same as that in the heat treatment atomic layer deposition process. Therefore, when transitioning from the repair step II to the cyclic deposition step I, there is no need to adjust the process temperature, thereby improving the repair effect of the repair gas on the damaged surface of the base 104 and simplifying the manufacturing process of the semiconductor structure. The temperature in the heat treatment atomic layer deposition process is 650-800° C. In this temperature range, the polar molecule in the repair gas has high activity, which can ensure a desirable repair effect of the repair gas on the damaged surface of the base 104.

Figure 7:
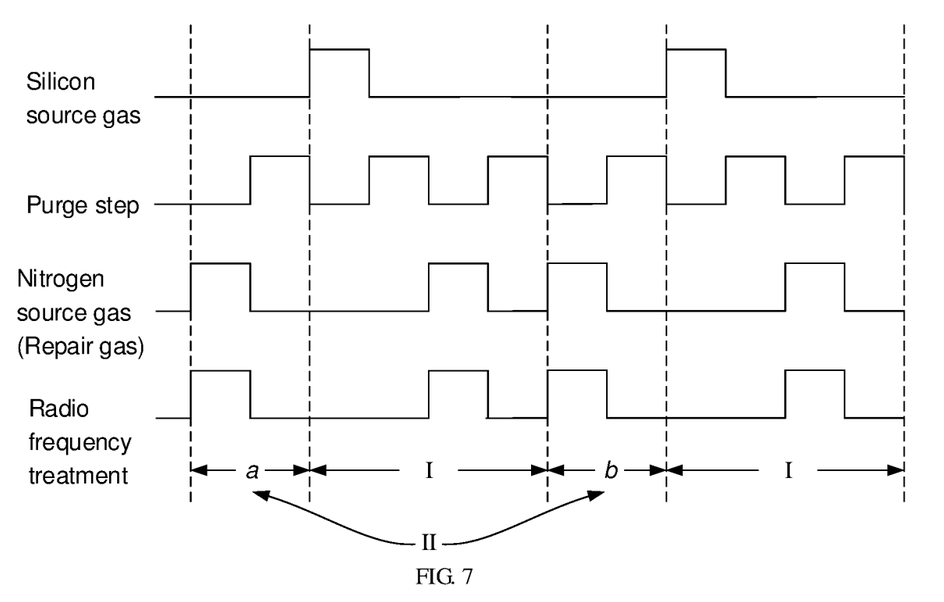
FIG. 7 illustrates a third cyclic change trend corresponding to each step when the silicon nitride film layer is deposited according to an embodiment of the disclosure.

In other embodiments, referring to FIG. 7, the atomic layer deposition process is a plasma atomic layer deposition process, and a process used in the repair step II is a plasma process. The plasma process includes a radio frequency (RF) treatment of the repair gas such that the repair gas is in a free radical state. This treatment improve the activity of the polar molecule in the repair gas, such that the hydrogen ions in the repair gas can more easily react with the hydrogen ions and hydroxide ions in the base 104, thereby improving the repair effect of the repair gas on the damaged surface of the base 104. The temperature in the plasma atomic layer deposition process is relatively low, namely, 550-630° C., which can ensure a desirable repair effect of the repair gas on the damaged surface of the base 104.

Figure 3:
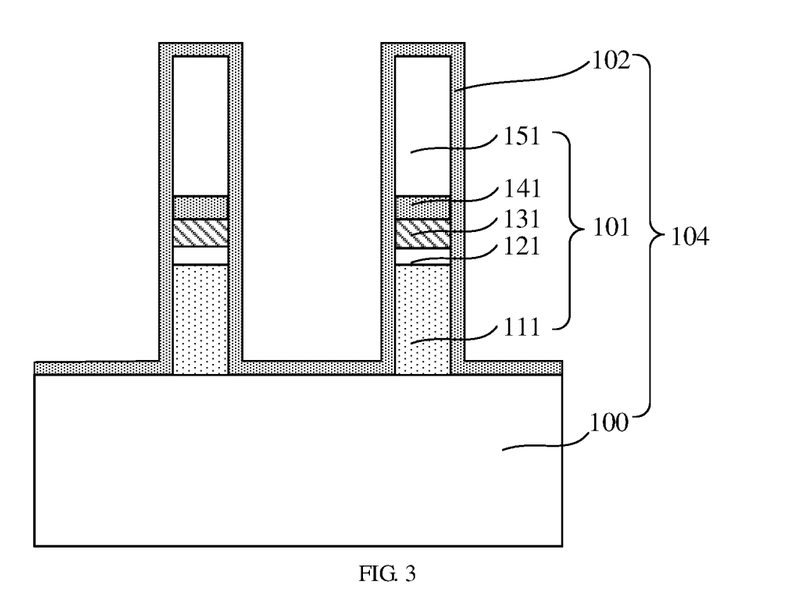
FIG. 3 is a sectional view illustrating a structure obtained by implementing a step of forming a buffer layer of the semiconductor structure according to an embodiment of the present disclosure.

In this embodiment, referring to FIG. 3, the step of providing the base 104 includes: provide a substrate 100; form bit line structures 101 spaced apart from each other on the substrate 100; and form a buffer layer 102 on a surface of each of the bit line structures 101 and a surface of the substrate 100, where the material of the buffer layer 102 is different from the material of the silicon nitride film layer 103 (refer to FIG. 4). The material of the buffer layer 102 may be silicon oxide.

In other embodiments, the base may be a structure at any stage during the manufacturing process of the semiconductor structure where a silicon nitride film layer needs to be deposited.

In this embodiment, the internal composition structure of the base is not limited.

In some embodiments of the present disclosure, each of the bit line structure 101 includes a bit line contact layer 111, a transition layer 121, a diffusion barrier layer 131, a metal layer 141 and a bit line insulating layer 151 that are sequentially stacked.

In this embodiment, in the step of forming the bit line structures 101 on the substrate 100, an etching process is used. Since the etching process inevitably causes certain damage to the surface of the substrate 100 and the surface of each of the bit line structures 101, there are a large number of broken chemical bonds on the surface of the substrate 100 and the surface of the bit line structure 101. Thus, there are many hydrogen ions and hydroxide ions on the surface of the substrate 100 and the surface of the bit line structure 101. This will affect the conductivity at a contact between the bit line structure 101 and the substrate 100, and affect the adhesion effect of a subsequent film layer to the surface of the substrate 100 and the surface of the bit line structure 101.

The hardness of the silicon nitride film layer 103 is much greater than that of the substrate 100 and the bit line structure 101. When the silicon nitride film layer 103 is directly formed on the surface of the substrate 100 and the surface of the bit line structure 101, a gap is likely to exist where the silicon nitride film layer 103 contacts the surface of the substrate 100 and the surface of the bit line structure 101. The silicon oxide layer 102 is first formed on the surface of the substrate 100 and the surface of the bit line structure 101. The hardness difference between the buffer layer 102 and the silicon nitride film layer 103 is small, and the hardness difference between the buffer layer 102 and the substrate 100 and the bit line structure 101 is also small. Therefore, the adhesion effect between the buffer layer 102 and the surface of the substrate 100 and the surface of the bit line structure 101 can be improved, and the adhesion effect between the buffer layer 102 and the silicon nitride film layer 103 can also be improved, thereby improving the yield of the semiconductor structure.

In this embodiment, the buffer layer 102 and the silicon nitride film layer 103 together serve as a protective layer for the bit line structure 101, which avoids damage to the bit line structure 101 caused by the subsequent etching process, and insulates the bit line structure 101 from other subsequently formed conductive layer.

The buffer layer 102 is formed by a low pressure chemical vapor deposition process. The buffer layer 102 formed by the chemical vapor deposition process has a low density. When the buffer layer 102 is made of silicon oxide, the formed buffer layer 102 has a net structure. It is easy for the repair gas to penetrate through the buffer layer 102 to repair the damaged surface of the substrate 100 and the damaged surface of the bit line structure 101, so as to improve the conductivity at the contact between the bit line structure 101 and the substrate 100. In addition, the chemical vapor deposition process has a fast deposition rate and saves the production time, thereby improving the production efficiency of the semiconductor structure.

In other embodiments, the buffer layer may also be formed by an atomic layer deposition process or an atmospheric pressure chemical vapor deposition process.

In this embodiment, the thickness of the buffer layer 102 in a direction perpendicular to the surface of the substrate 100 is 2-6 nm. In an exemplary embodiment, the thickness of the buffer layer 102 is 4 nm. The buffer layer 102 is thin, such that the repair gas can penetrate through the buffer layer 102 quickly to contact the surface of the substrate 100 and the surface of the bit line structure 101, thereby ensuring a desirable repair effect of the repair gas on the damaged surface of the substrate 100 and the damaged surface of the bit line structure 101.

In some embodiments, since the silicon oxide buffer layer 102 has a net structure, it holds a large amount of hydrogen ions and hydroxide ions. When the repair gas repairs the surface of the substrate 100 and the surface of the bit line structure 101, the hydrogen ions in the repair gas will also react with the hydrogen ions and hydroxide ions in the buffer layer 102 to generate hydrogen gas and water vapor to escape the buffer layer. This reduces the hydrogen content and oxygen content of the buffer layer 102 and improves the strength and damage resistance of the buffer layer 102.

In this embodiment, referring to FIG. 6, the duration of the first repair step a is longer than that of the second repair step b. In the first repair step a, the repair gas repairs most of the damaged surface of the substrate 100 and most of the damaged surface of the bit line structure 101 to ensure a desirable repair effect on the damaged surface of the substrate 100 and the damaged surface of the bit line structure 101. In addition, in the first repair step a, most of the repair gas has enough time to penetrate through the buffer layer 102 to contact the surface of the substrate 100 and the surface of the bit line structure 101, so as to repair the damaged surface of the substrate 100 and the damaged surface of the bit line structure 101.

The duration of the first repair step a is 1-10 min. In an exemplary embodiment, the duration of the first repair step a may be 8 min. In such a duration, the repair gas in the first repair step a repairs most of the damaged surface of the substrate 100 and most of the damaged surface of the bit line structure 101, which improves the conductivity at the contact between the bit line structure 101 and the substrate 100 and improves the yield of the semiconductor structure.

The duration of the second repair step b is 1-50 s. In an exemplary embodiment, the duration of the second repair step b may be 40 s. Such a duration facilitates the further repairing of the damaged surface of the substrate 100 and the damaged surface of the bit line structure 101, so as to improve the repair effect of the repair gas on the damaged surface of the substrate 100 and the damaged surface of the bit line structure 101. Therefore, the conductivity at the contact between the bit line structure 101 and the substrate 100 is further improved, and the yield of the semiconductor structure is further improved.

In other embodiments, the duration of the first repair step a may also be equal to that of the second repair step b. The duration of the first repair step a and the duration of the second step b may respectively be 1-10 min.

The repair gas includes a first repair gas in the first repair step a and a second repair gas in the second repair step b. The flow rate of the first repair gas is greater than that of the second repair gas. Within the same duration, this flow rate design can increase the amount of the repair gas that penetrates through the buffer layer 102 to contact the surface of the substrate 100 and the surface of the bit line structure 101, which ensures a desirable repair effect of the repair gas on the damaged surface of the substrate 100 and the damaged surface of the bit line structure 101.

The flow rate of the first repair gas is 3-10 L/min. In an exemplary embodiment, the flow rate of the first repair gas may be 8 L/min Within this flow rate range, a large amount of first repair gas penetrates through the buffer layer 102 to repair most of the damaged surface of the substrate 100 and most of the damaged surface of the bit line structure 101. This ensures a desirable repair effect of the first repair gas on the surface of the substrate 100 and the surface of the bit line structure 101, and also ensures desirable electrical conductivity at the contact between the bit line structure 101 and the substrate 100.

The flow rate of the second repair gas is 2-5 L/min. In an exemplary embodiment, the flow rate of the second repair gas may be 4 L/min, such that the second repair gas further repairs the damaged surface of the substrate 100 and the damaged surface of the bit line structure 101. This further improves the overall repair effect of the repair step II on the surface of the substrate 100 and the surface of the bit line structure 101, thereby further improving the conductivity at the contact between the bit line structure 101 and the substrate 100 and the yield of the semiconductor structure.

In other embodiments, the flow rate of the first repair gas may be equal to that of the second repair gas. The flow rates of the first repair gas and the second repair gas may be 3-10 L/min, respectively.

In other embodiments, according to the structure of the base and the etching process, the duration of the first repair step, the duration of the second repair step, the flow rate of the first repair gas and the flow rate of the second repair gas may be adjusted appropriately to ensure a desirable repair effect of the repair gas on the surface of the substrate in the repair step.

In this embodiment, when the silicon nitride film layer 103 is formed on the base 104 by the atomic layer deposition process, a repair step II is added before each cyclic deposition step I. The repair step II includes: provide a hydrogen-containing repair gas to the surface of the base 104, the repair gas including a polar molecule. The repair gas and the nitrogen source gas used to form the silicon nitride film layer 103 are the same type of gas, which simplifies the manufacturing process of the semiconductor structure and reduces the manufacture cost of the semiconductor structure. In addition, the repair gas and the nitrogen source gas are treated by the same process, which improves the activity of the polar molecule in the repair gas under the premise of ensuring the formation of a good-quality silicon nitride film layer. This improves the repair effect of the polar molecule on the damaged surface of the base 104 through a valence bond, reduces the hydrogen and oxygen content in the base 104, and improves the strength and damage resistance of the base 104, thereby improving the yield and conductivity of the semiconductor structure.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It should be understood that the terms such as "first" and "second" used herein may be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of manufacturing a semiconductor structure provided by the embodiment of the present disclosure, when the silicon nitride film layer is formed on the base by the atomic layer deposition process, a repair step is added before each cyclic deposition step. This reduces the hydrogen and oxygen content in the base, reduces the content of impurity elements in the base, and improves the strength and damage resistance of the base, thereby achieving the effect of repairing the damaged surface of the base and improving the yield and conductivity of the semiconductor structure.

The invention claimed is:

1. A method of manufacturing a semiconductor structure, comprising:
    providing a base; and
    forming a silicon nitride film layer on the base by an atomic layer deposition process; wherein the atomic layer deposition process comprises multiple cyclic deposition steps; in each of the cyclic deposition steps, a silicon source gas and a nitrogen source gas are provided to a surface of the base;
    wherein, before each of the cyclic deposition steps, the method of manufacturing a semiconductor structure further comprises a repair step; in the repair step, a repair gas is provided to the surface of the base, and the repair gas is a hydrogen-containing repair gas; the repair gas comprises a polar molecule for repairing the surface of the base that is damaged.

2. The method of manufacturing a semiconductor structure according to claim 1, wherein the repair gas and the nitrogen source gas are the same type of gas.

3. The method of manufacturing a semiconductor structure according to claim 2, wherein the repair gas comprises ammonia gas.

4. The method of manufacturing a semiconductor structure according to claim 1, wherein the repair step comprises a first repair step and a second repair step; the first repair step is performed before a first cyclic deposition step, and the second repair step is performed between every two adjacent cyclic deposition steps; the duration of the first repair step is longer than the duration of the second repair step.

5. The method of manufacturing a semiconductor structure according to claim 4, wherein the step of providing a base comprises: providing a substrate; forming bit line structures spaced apart from each other on the substrate; and forming a buffer layer on a surface of each of the bit line structures and a surface of the substrate, wherein a material of the buffer layer is different from a material of the silicon nitride film layer.

6. The method of manufacturing a semiconductor structure according to claim 5, wherein a process of forming the buffer layer comprises a low pressure chemical vapor deposition process.

7. The method of manufacturing a semiconductor structure according to claim 5, wherein the thickness of the buffer layer in a direction perpendicular to the surface of the substrate is 2-6 nm.

8. The method of manufacturing a semiconductor structure according to claim 5, wherein the duration of the first repair step is 1-10 min.

9. The method of manufacturing a semiconductor structure according to claim 5, wherein the duration of the second repair step is 1-50 s.

10. The method of manufacturing a semiconductor structure according to claim 5, wherein, the bit line structure comprises a bit line contact layer, a transition layer, a diffusion barrier layer, a metal layer and a bit line insulating layer that are sequentially stacked.

11. The method of manufacturing a semiconductor structure according to claim 4, wherein the repair gas comprises a first repair gas in the first repair step and a second repair gas in the second repair step; a flow rate of the first repair gas is greater than a flow rate of the second repair gas.

12. The method of manufacturing a semiconductor structure according to claim 11, wherein the flow rate of the first repair gas is 3-10 L/min.

13. The method of manufacturing a semiconductor structure according to claim 11, wherein the flow rate of the second repair gas is 2-5 L/min.

14. The method of manufacturing a semiconductor structure according to claim 4, wherein, the duration of the first repair step is 1-10 min, and the duration of the second repair step is 1-50 s.

15. The method of manufacturing a semiconductor structure according to claim 1, wherein after the repair step, the method of manufacturing a semiconductor structure further comprises a purge step to remove the repair gas.

16. The method of manufacturing a semiconductor structure according to claim 1, wherein the atomic layer deposition process is a heat treatment atomic layer deposition process, and a process used in the repair step is a heat treatment process.

17. The method of manufacturing a semiconductor structure according to claim 16, wherein a temperature in the repair step is the same as a temperature in the heat treatment atomic layer deposition process.

18. The method of manufacturing a semiconductor structure according to claim 1, wherein the atomic layer deposition process is a plasma atomic layer deposition process, and a process used in the repair step is a plasma process.

19. The method of manufacturing a semiconductor structure according to claim 1, wherein, the step of a silicon source gas and a nitrogen source gas are provided to a surface of the base comprises: the silicon source gas is provided to the surface of the base, the silicon source gas is maintained on the surface of the base by a saturated adsorption reaction; and then, the nitrogen source gas is provided to the surface of the base, the nitrogen source gas reacts with the silicon source gas adsorbed on the surface of the base, to form a layer of silicon nitride.

20. The method of manufacturing a semiconductor structure according to claim 1, wherein, the silicon source gas is dichlorosilane, silane, disilane, trichlorosilane or hexachlorodisilane; and the nitrogen source gas is ammonia gas or nitrogen gas.

\* \* \* \* \*